(12) United States Patent
Pan et al.

(10) Patent No.: US 7,041,548 B1
(45) Date of Patent: May 9, 2006

(54) METHODS OF FORMING A GATE STACK THAT IS VOID OF SILICON CLUSTERS WITHIN A METALLIC SILICIDE FILM THEREOF

(75) Inventors: Pai-Hung Pan, Boise, ID (US); Louie Liu, Meridian, ID (US); Ravi Iyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 288 days.

(21) Appl. No.: 09/614,113

(22) Filed: Jul. 12, 2000

Related U.S. Application Data

(60) Continuation of application No. 09/073,494, filed on May 6, 1998, which is a division of application No. 08/682,935, filed on Jul. 16, 1996, now Pat. No. 6,087,254.

(51) Int. Cl.
*H01L 21/8238* (2006.01)

(52) U.S. Cl. .................. 438/230; 438/239; 438/303; 438/586; 438/587; 438/588; 438/592

(58) Field of Classification Search ................. 438/230, 438/239, 303, 586–595, 706, 720, 723, 724, 438/725, 745, 754, 756, 757
See application file for complete search history.

(56) References Cited

U.S. PATENT DOCUMENTS

| | | | |
|---|---|---|---|
| 4,443,930 A | 4/1984 | Hwang et al. | |
| 4,704,783 A | * 11/1987 | Possin et al. | 437/40 |
| 4,755,480 A | 7/1988 | Yau et al. | |
| 4,782,037 A | 11/1988 | Tomozawa et al. | |
| 5,006,421 A | 4/1991 | Yang et al. | |
| 5,103,272 A | 4/1992 | Nishiyama | 257/388 |
| 5,183,782 A | 2/1993 | Onishi et al. | 438/654 |
| 5,268,330 A | 12/1993 | Givens et al. | 438/586 |
| 5,320,975 A | 6/1994 | Cederbaum et al. | 438/153 |
| 5,322,806 A | 6/1994 | Kohno et al. | 438/573 |
| 5,428,244 A | * 6/1995 | Segawa et al. | 257/646 |
| 5,438,006 A | * 8/1995 | Chang et al. | 437/40 |
| 5,472,896 A | 12/1995 | Chen et al. | |
| 5,492,597 A | 2/1996 | Keller | 438/721 |
| 5,512,502 A | 4/1996 | Ootsuka et al. | 438/305 |
| 5,518,942 A | 5/1996 | Shrivastava | 438/264 |
| 5,518,958 A | 5/1996 | Giewont et al. | 438/592 |
| 5,656,546 A | 8/1997 | Chen et al. | 438/586 |
| 5,665,646 A | 9/1997 | Kitano | 438/592 |
| 5,728,625 A | 3/1998 | Tung | 438/586 |
| 6,087,254 A | * 7/2000 | Pan et al. | 438/659 |
| 6,137,130 A | * 10/2000 | Sung et al. | 257/306 |
| 6,465,295 B1 | 10/2002 | Kitamura | |

FOREIGN PATENT DOCUMENTS

EP      0 591 086 A2     4/1994

* cited by examiner

*Primary Examiner*—Duy-Vu N. Deo
(74) *Attorney, Agent, or Firm*—TraskBritt

(57) ABSTRACT

A method for forming a gate stack which minimizes or eliminates damage to the gate dielectric layer and/or silicon substrate during the gate stack formation by the reduction of the temperature during formation. The temperature reduction prevents the formation of silicon clusters within the metallic silicide film in the gate stack which has been found to cause damage during the gate etch step. The present invention also includes methods for dispersing silicon clusters prior to the gate etch step.

12 Claims, 14 Drawing Sheets

METHODS OF FORMING A GATE STACK THAT IS VOID OF SILICON CLUSTERS WITHIN A METALLIC SILICIDE FILM THEREOF

CROSS-REFERENCE TO RELATED APPLICATIONS

This application is a continuation of application Ser. No. 09/073,494, filed May 6, 1998, pending, which is a divisional of application Ser. No. 08/682,935, filed Jul. 16, 1996, now U.S. Pat. No. 6,087,254, issued Jul. 11, 2000.

BACKGROUND OF THE INVENTION

1. Field of the Invention

The present invention relates to a method for forming a gate stack which minimizes or eliminates damage to the gate dielectric layer and/or the silicon substrate during gate stack formation. More particularly, the present invention relates to reducing temperature during the fabrication of the gate stack to eliminate the formation of silicon clusters within the metallic silicide film of the gate stack. The present invention also includes methods for dispersing silicon clusters prior to the gate etch step.

2. State of the Art

The operating speed of semiconductor devices in very large scale integration ("VSLI") and ultra large scale integration ("USLI") depends primarily on the resistivity of the conductive material (hereinafter "trace material") used to transmit signals from one circuit component to another circuit component. Additionally, in order to increase the circuit component density and/or reduce the complexity of the metal connections between the circuit components, a highly conductive trace material layer is required on the gate stack. Thus, the trace material must be a low-resistivity material.

Metallic silicides have recently become popular for use as low-resistivity trace material. Tungsten silicide ("$WSi_x$") has become a leading low-resistivity trace material. Various etching chemistries have been developed to pattern the $WSi_x$ to form such conductors as the digitlines or wordlines used in memory devices (see commonly owned U.S. Pat. No. 5,492,597, hereby incorporated herein by reference). Other metallic silicides used in gate stacks include cobalt silicide ("$CoSi_x$"), molybdenum silicide ("$MoSi_x$"), and titanium silicide ("$TiSi_x$"). These metallic silicides have lower resistivity and are easier to fabricate than other conductors used for this purpose. However, metallic silicides are prone to oxidization. Furthermore, the metal components of the metallic silicides react chemically when they contact other elements. These properties present several problems, including degradation of the semiconductor element and peeling of the metallic silicide film. To compensate for these problems, a polysilicon layer is usually disposed between a gate dielectric layer and the metallic silicide film, and a dielectric cap layer is usually disposed above the metallic silicide film to isolate the metallic silicide.

FIGS. 14–19 illustrate, in cross section, a conventional method of forming a gate stack having a metallic silicide film layer. FIG. 14 illustrates a gate dielectric layer 204 such as silicon dioxide ($SiO_2$) grown (by oxidation) or deposited (by any known industry standard technique, such chemical vapor deposition or the like) on a silicon substrate 202. A polysilicon layer 206 is formed on top of the gate dielectric layer 204, as shown in FIG. 15. The polysilicon layer 206 is then subjected to an ion implantation with gate impurities (not shown). As shown in FIG. 16, a metallic silicide film 208 is deposited on the polysilicon layer 206. The structure is then subjected to a heat treatment for about 30 minutes at a temperature between about 850° C. and 950° C. for activation of the impurities in the polysilicon layer 206 and to anneal the metallic silicide film 208. The heat treatment temperature level is dictated by the temperature required to anneal the metallic silicide film 208. The annealing of the metallic silicide film 208 is used to reduce its resistivity.

As shown in FIG. 17, a silicon dioxide cap 210 is then deposited on the metallic silicide film 208 at temperatures over 600° C. by chemical vapor deposition ("CVD"), low pressure chemical vapor deposition ("LPCVD"), or the like. A resist 212 is then formed and patterned on the silicon dioxide cap 210, as illustrated in FIG. 18. The layered structure is then etched and the resist 212 is stripped to form a gate stack 214, as illustrated in FIG. 19. However, this etching results in pitting on the gate dielectric layer 204. This pitting is illustrated in FIG. 20 wherein a plurality of pits 216 is distributed on the gate dielectric layer 204 between the gate stacks 214.

This pitting is also illustrated in FIG. 19. A pit in the dielectric layer 204 may be shallow, such as shallow pit 218. However, a deep pit, such as deep pit 220, can extend through the gate dielectric layer 204 and into the silicon substrate 202. The pitting into the silicon substrate 202 will cause junction leakage, refresh problems, and potential destruction of the component. At present, most gate dielectric layers are about 80 Å thick. However, as semiconductor devices continue to be miniaturized, these gate dielectric layers will become thinner. As the gate dielectric layers become thinner, it is more likely that pitting will penetrate through the gate dielectric layer to contact the silicon substrate and cause the aforementioned problems.

Therefore, it would be advantageous to develop a technique which minimizes or eliminates pitting on the gate dielectric layer caused by gate stack etching, while using state-of-the-art semiconductor device fabrication techniques employing known equipment, process steps, and materials.

BRIEF SUMMARY OF THE INVENTION

The present invention relates to the reduction of the temperature during the fabrication of the gate stack to eliminate the formation of silicon clusters within a metallic silicide film of the gate stack. The elimination of the formation of the silicon clusters minimizes or eliminates damage to the gate dielectric layer and/or silicon substrate during the gate stack formation. The present invention also includes methods for implanting the gate stack layers to disperse the silicon clusters (if they are present in the metallic silicide film) prior to the gate etch step.

One aspect of the method of the present invention begins by forming a gate dielectric layer on a silicon substrate. A polysilicon or amorphous silicon layer (hereinafter "polysilicon layer") is then formed on top of the gate dielectric layer. The polysilicon layer is subjected to an ion implantation with gate impurities and a non-annealed metallic silicide film is thereafter deposited atop the polysilicon layer. A dielectric cap layer is then deposited over the metallic silicide film at a sufficiently low temperature such that the metallic silicide does not anneal. A resist mask is placed over the cap layer and the structure is etched down to the gate dielectric layer to form a gate stack.

Metallic silicides are generally represented by the formula "$MSi_x$" wherein: "M" is the metal component (i.e., cobalt "Co," molybdenum "Mo," titanium "Ti," tungsten "W," and the like), "Si" is silicon, and "x" is the number of silicon molecules per metal component molecule ("x" is usually between about 2 and 3). Metallic silicide films tend to peel when a low ratio of silicon to metal component is used for gate stack formation (e.g., when "x" is less than 2). In order to reduce the stress of metallic silicide film which causes peeling, a silicon rich metallic silicide film is used in gate stack formation. In particular with the use of $WSi_x$, an "x"of about 2.3 is preferred.

In prior art techniques, the metallic silicide is annealed to form a crystalline structured metallic silicide film 502, as illustrated in FIG. 23, between a polysilicon layer 504 (atop a gate dielectric layer 506, which is on a silicon substrate 508) and a silicon dioxide layer 510 (below a dielectric cap 512). However, when a silicon rich metallic silicide is used, the annealing step causes the silicon within the metallic silicide to form clusters 514 inside the crystalline structured metallic silicide film 502. These silicon clusters 514 can also form during the subsequent high temperature steps, even if the annealing step does not take place. In specific process terms, the step of forming a dielectric cap over the metallic silicide can exceed 600° C., particularly when deposition techniques such as LPCVD and sputtering are used. These high temperature steps can cause the formation of silicon clusters 514 within the crystalline structured metallic silicide film 502. This can be seen in FIG. 21 wherein a large plurality of pits 304 is formed in the surface of the gate dielectric layer 306 between a plurality of gate stacks 302 (high temperature cap formation only, no annealing step).

It has been found that the pitting on the gate dielectric layer during the full gate stack (cap/metallic silicide/polysilicon) etch is caused by the presence of the silicon clusters inside the metallic silicide film. The etch rate of these silicon clusters has been found to be about 1.2 times that of the metallic silicide film (in the case of tungsten silicide film) during the gate stack etch. Thus, the etch tunnels into the metallic silicide at each silicon cluster. This tunneling is, in turn, translated into the surface of the gate dielectric layer, thereby forming the pits.

By preventing the growth and formation of the silicon clusters in the metallic silicide film, the problem of pitting on the silicon substrate during the gate stack etch can be eliminated. Although prior art techniques anneal the metallic silicide film to reduce its resistivity and consequentially forming the undesirable silicon clusters, it has been found that, for most purposes, the metallic silicide film has sufficiently low resistivity without annealing. Thus, one aspect of the method of the present invention eliminates annealing the metallic silicide film. Although the step of annealing the metallic silicide film also activates gate impurities, the activation of the gate impurities can be completed during subsequent heat cycles after the etching of the gate stack, such as during shallow junction formation.

In a preferred variation of the method, the dielectric cap is selectively deposited on an upper surface of the metallic silicide film at low temperatures. The dielectric cap material is preferably silicon nitride. The deposition of the silicon nitride layer is carried out at between about 400° C. and 600° C., which temperature does not anneal the metallic silicide film, and thus does not result in the growth and formation of silicon clusters in the metallic silicide film. It is, of course, understood that the cap can include silicon dioxide layers, or the like, so long as deposition is performed at temperatures below about 600° C. Forming the cap by selectively depositing silicon nitride by plasma-enhanced chemical vapor deposition ("PECVD") is also preferred, since only one surface of the substrate is covered by the dielectric material which eliminates the necessity of removing the cap material from the semiconductor substrate back surface, thus providing a process cost advantage.

FIG. 24 is a side cross-sectional view of a layered gate stack structure of the present invention prior to etching, depicting a silicon nitride cap 602, a silicon dioxide layer 604, a metallic silicide film 606, a polysilicon layer 608, a gate dielectric layer 610, and a silicon substrate 612. Since no high temperature cycle occurs during the layered gate stack structure formation, the metallic silicide film 606 does not form a crystalline structure, nor does it contain silicon clusters. Thus, as illustrated in FIG. 22, the method of the present invention does not initiate damage or pitting on the gate dielectric layer 402 during the etching and formation of the gate stacks 404.

In situations where a high temperature heat cycle (cap deposition and/or annealing) is required, an ion implantation into the metallic silicide film can be performed to amorphize the metallic silicide film (i.e., disperse the silicon clusters back into the metallic silicide film) before masking and etching. The implantation ions can be silicon, tungsten, argon, or the like, or a dopant (phosphorous, arsenic, boron, and the like). The implantation can be performed before and/or after the cap deposition. The implantation energy is preferably between about 20 keV and 200 keV. The ion dose ranges from between about $1E^{13}$ and $1E^{16}$. The implantation energy and dose depend on the metallic silicide film thickness, the metallic silicide composition (i.e., ratio of silicon to metal component), the anneal heat cycle temperature, and the implantation ion used. However, it is preferred that the peak of the implantation occur at about the middle of the metallic silicide film. Furthermore, it is preferred that the dopant ion (phosphorous, arsenic, boron, and the like) amorphize the metallic silicide film. For example, for a metallic silicide film which is about 1800 Å thick and annealed at about 850° C. for about 30 minutes, a phosphorous implantation at about 75 keV and $1E^{15}$ is required to amorphize the metallic silicide.

It is, of course, understood that if a lower resistivity in the metallic silicide is required for a specific application, the gate stack can be subjected to a heat cycle after gate stack etching to anneal the metallic silicide in the gate stack. However, if the gate stack is annealed after formation, the anneal temperature must be increased by about 30° C. to 50° C. to achieve the same resistivity.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Figure 1:
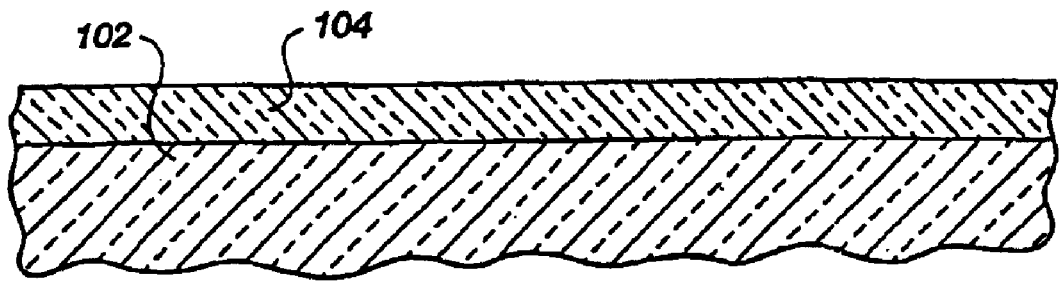
FIGS. 1–6 are side cross-sectional views of a gate stack formation method of the present invention.
Figure 2:
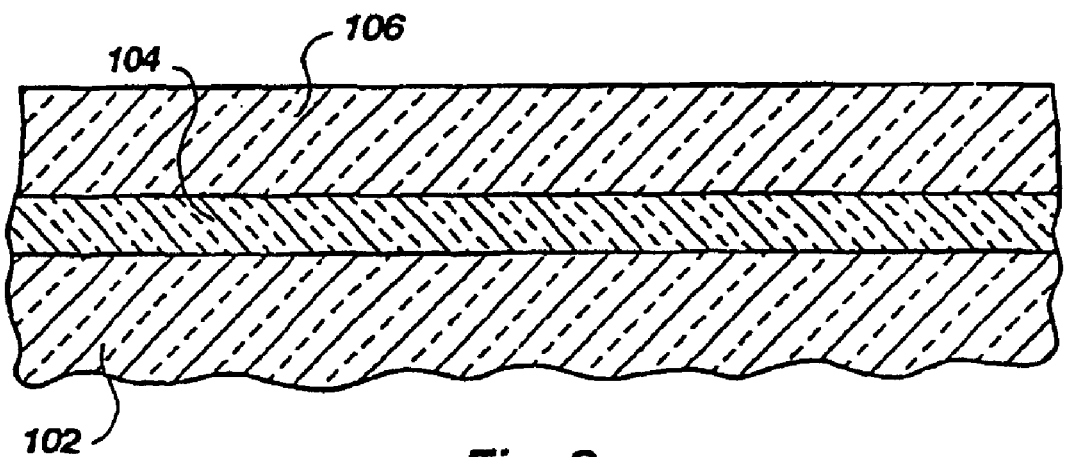
Figure 3:
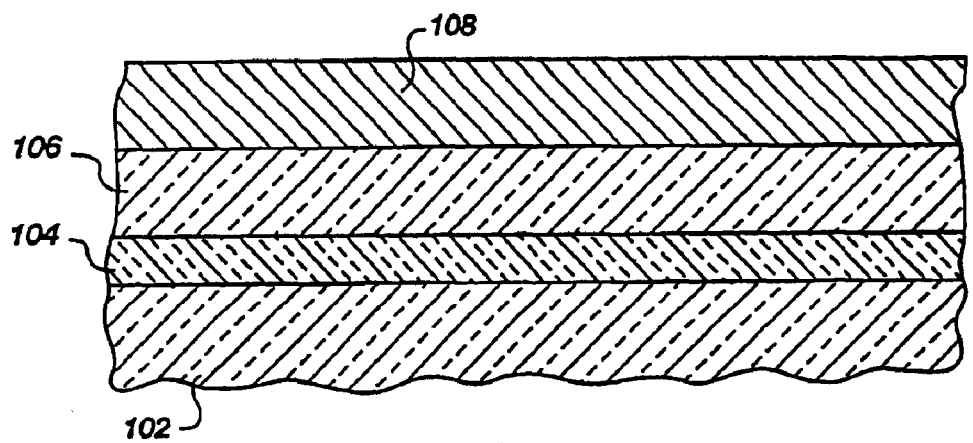

FIGS. 1–6 illustrate a method, in cross section, of forming a gate stack of the present invention. FIG. 1 illustrates a gate dielectric layer 104, such as silicon dioxide, formed on a silicon substrate 102. A polysilicon layer 106 is formed on top of the gate dielectric layer 104, as shown in FIG. 2. The polysilicon layer 106 is then subjected to an ion implantation with gate impurities (not shown). As shown in FIG. 3, a metallic silicide film 108 is deposited on the polysilicon layer 106. The metallic silicide film can be deposited by CVD (including LPCVD, APCVD, and PECVD), sputtering, or the like.

Figure 4:
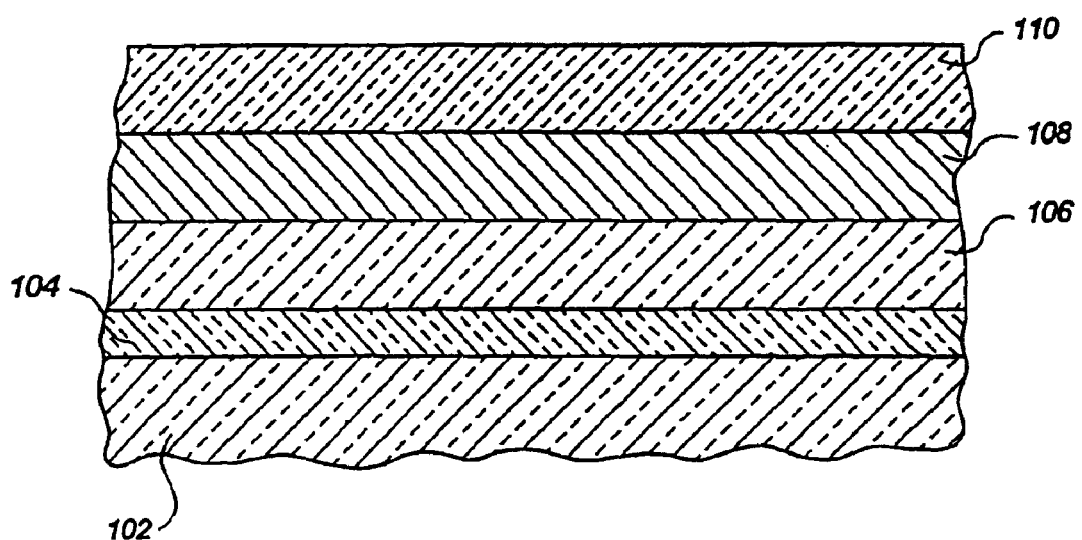

A cap 110, preferably including silicon nitride, is then deposited on the metallic silicide film 108, as shown in FIG. 4. The deposition of the silicon nitride layer is carried out at between about 400° C. and 600° C. and preferably at about 500° C., by CVD (including LPCVD, APCVD, and PECVD), sputtering, spin-on techniques, or the like. In a preferred embodiment, the deposition of the silicon nitride is accomplished by plasma-enhanced chemical vapor deposition. It is, of course, understood that the cap 110 can include other dielectric material, such as silicon dioxide, as long as it deposited at temperatures below about 600° C.

Figure 5:
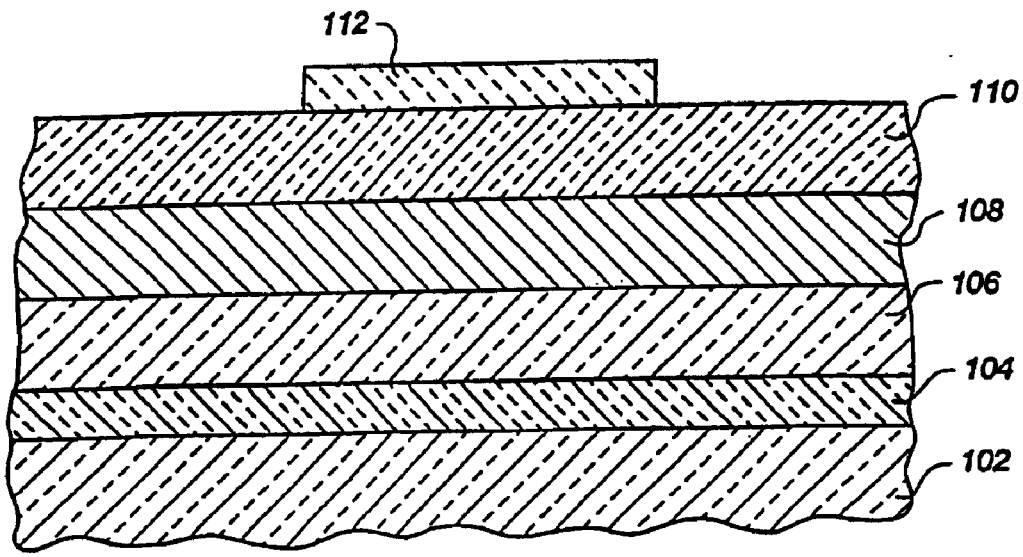
Figure 6:
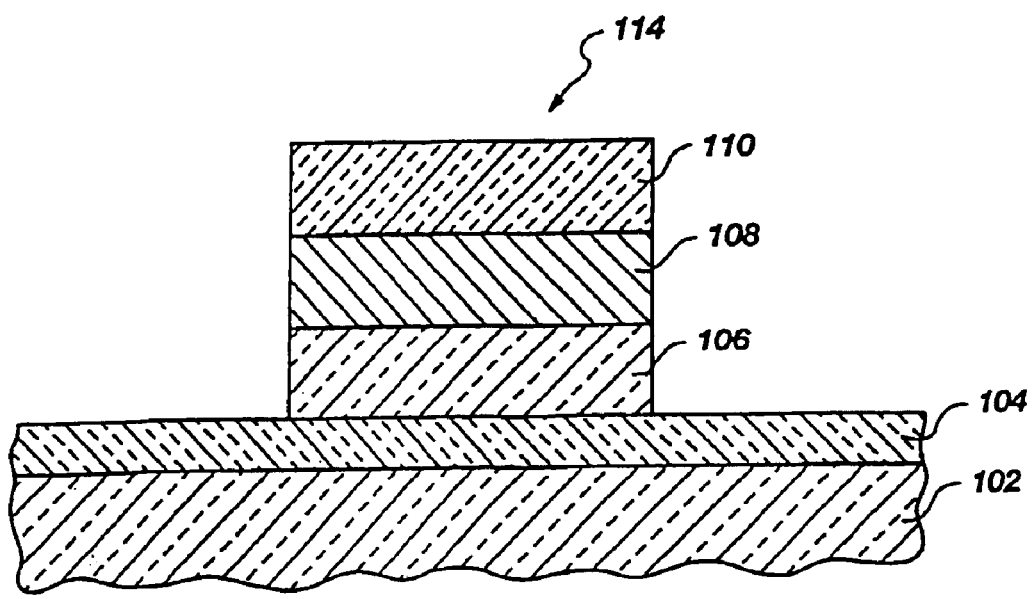

A resist 112 is then formed and patterned on the cap 110, as illustrated in FIG. 5. The structure is then etched and the resist 112 stripped to form a gate stack 114, as shown in FIG. 6.

Figure 7:
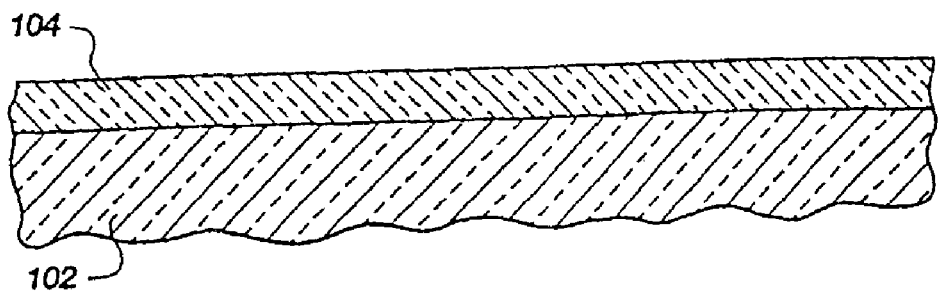
FIGS. 7–13 are side cross-sectional views of an alternate gate stack formation method of the present invention.
Figure 8:
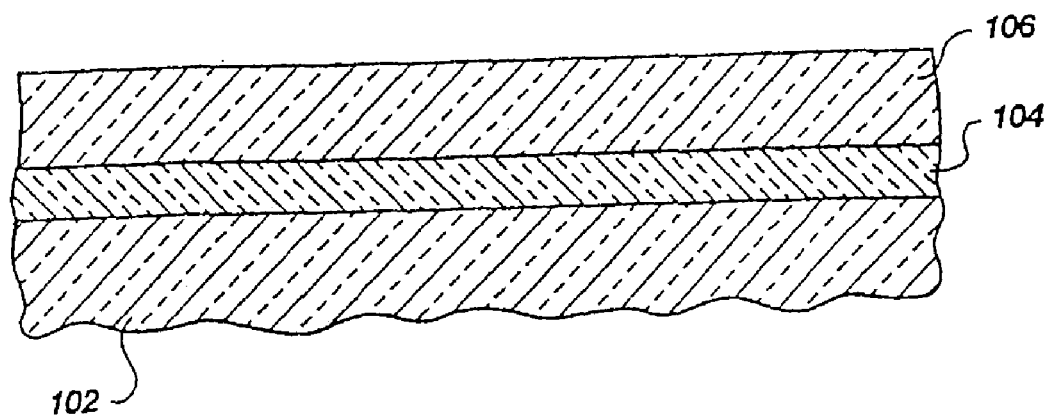
Figure 9:
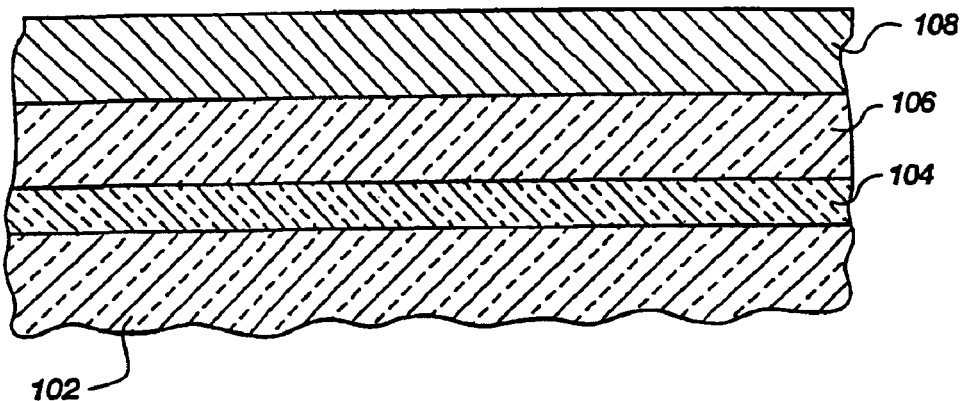
Figure 10:
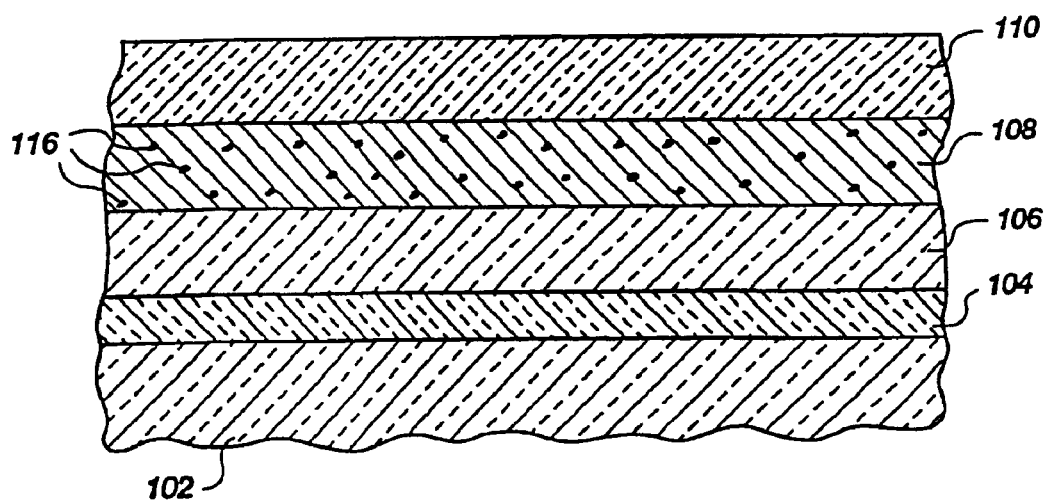

FIGS. 7–13 illustrate an alternate method, in cross section, of forming a gate stack of the present invention. The steps of the alternate method are similar to the method illustrated in FIGS. 1–6; therefore, components common to both FIGS. 1–6 and FIGS. 7–13 retain the same numeric designation. FIG. 7 illustrates a gate dielectric layer 104 grown or deposited on a silicon substrate 102. A polysilicon layer 106 is formed on top of the gate dielectric layer 104, as shown in FIG. 8. The polysilicon layer 106 is then subjected to an ion implantation with gate impurities (not shown). As shown in FIG. 9, a metallic silicide film 108 is deposited on the polysilicon layer 106. A cap 110 is then deposited on the metallic silicide film 108, as shown in FIG. 10. The structure 118 (FIG. 11) is subjected to a heat cycle either to anneal the metallic silicide film 108 prior to depositing the cap 110, to form the cap 110 with a high temperature process (i.e., over 600° C.), or both, such that silicon clusters 116 are formed in the metallic silicide film 108.

Figure 11:
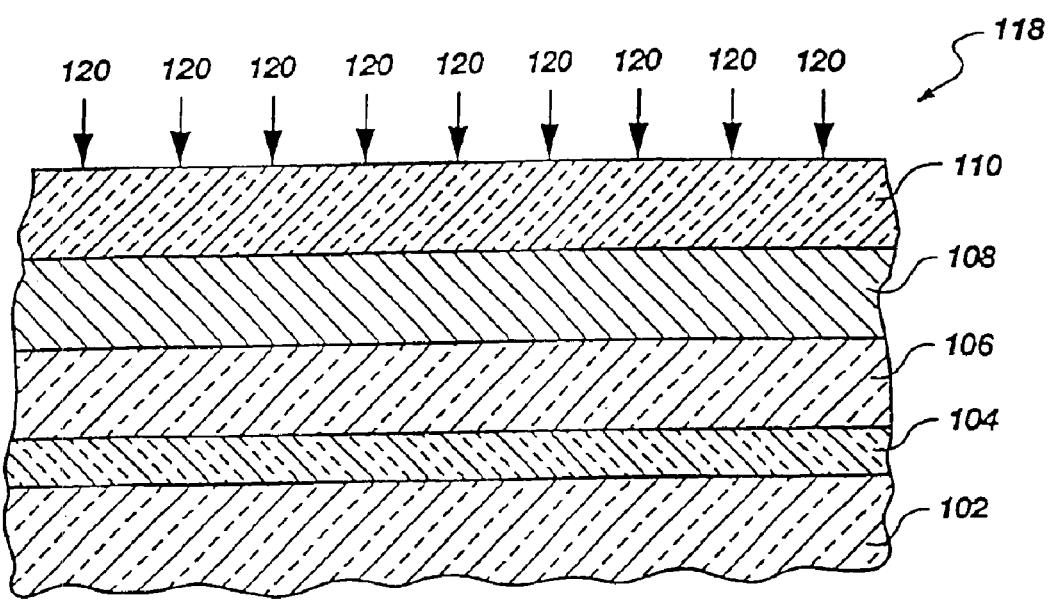
Figure 12:
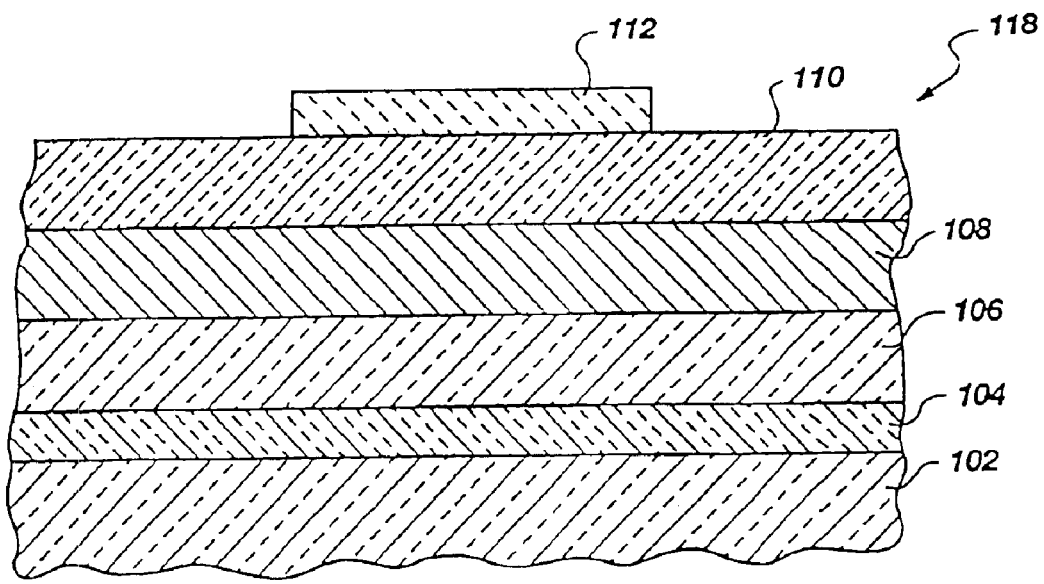
Figure 13:
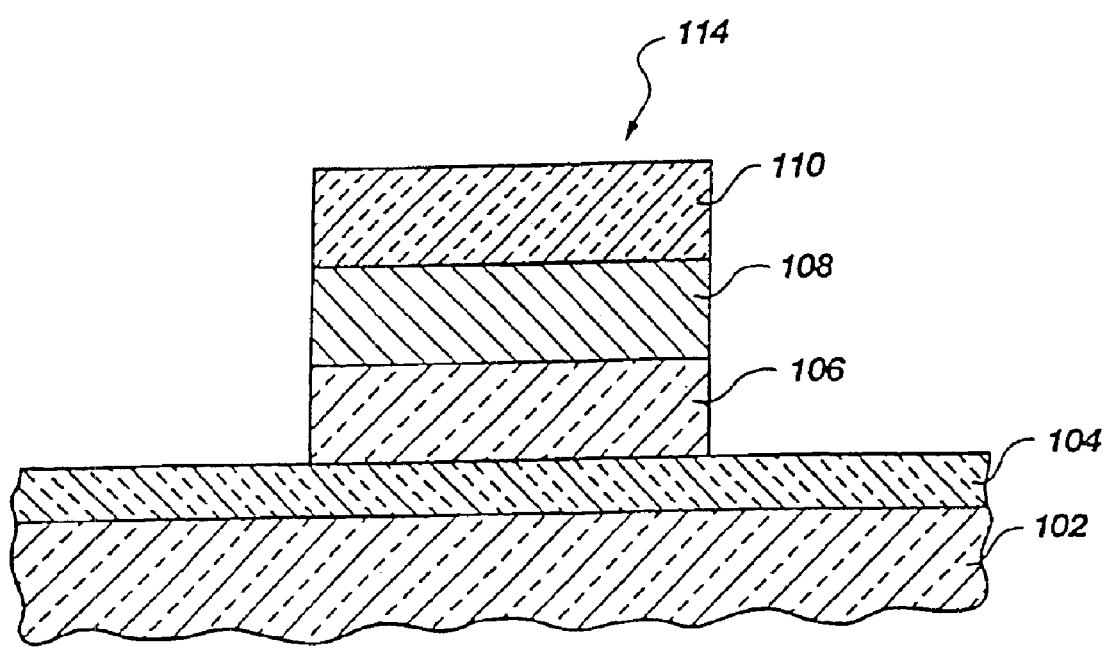
Figure 14:
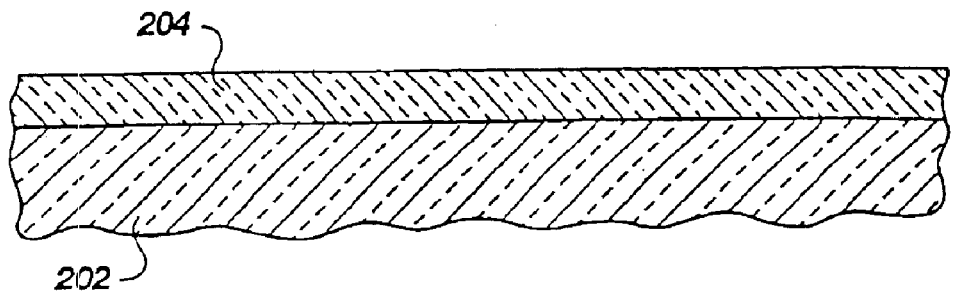
FIGS. 14–19 are side cross-sectional views of a prior art gate stack formation method.
Figure 15:
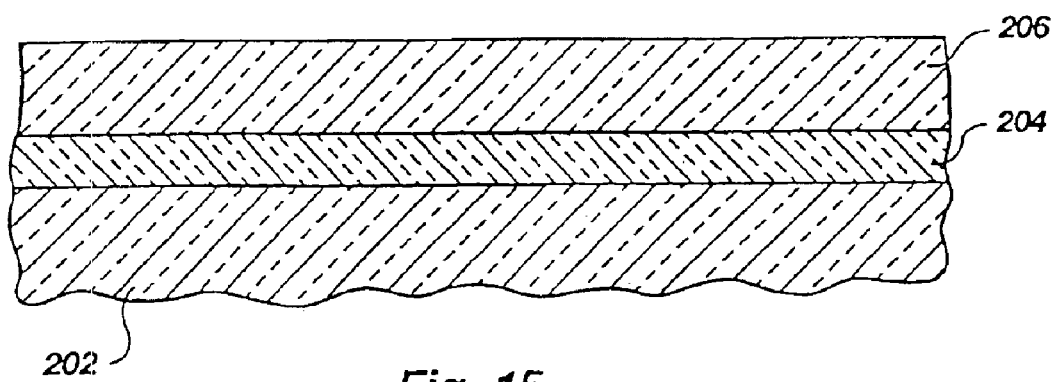
Figure 16:
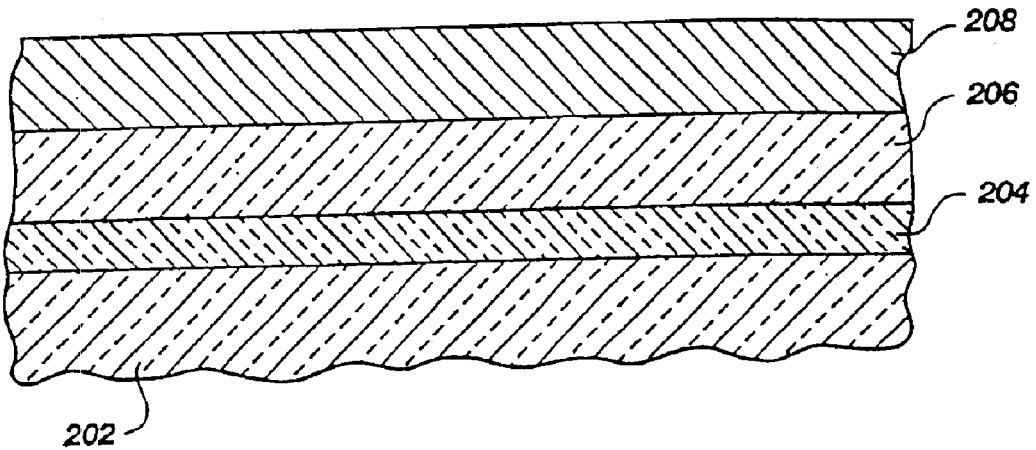
Figure 17:
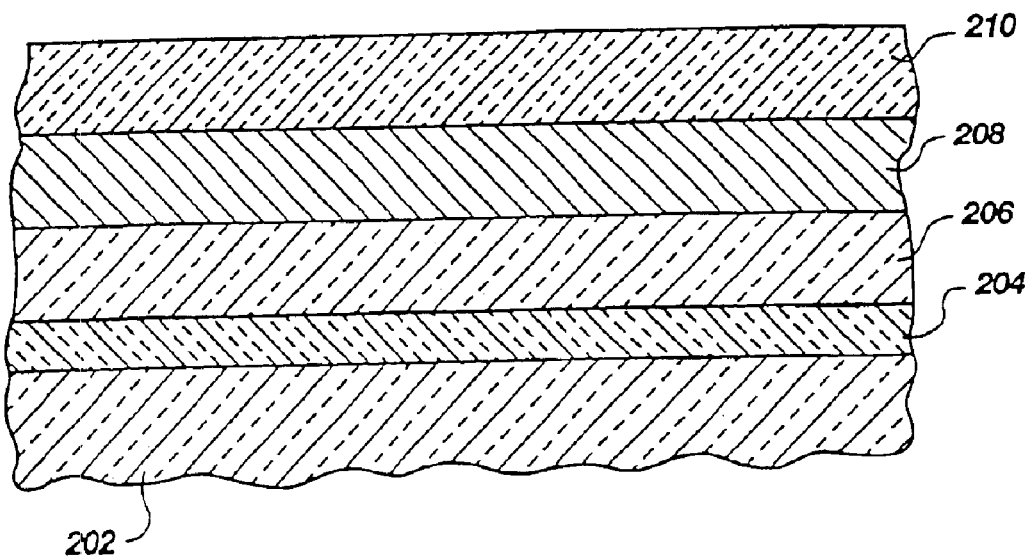
Figure 18:
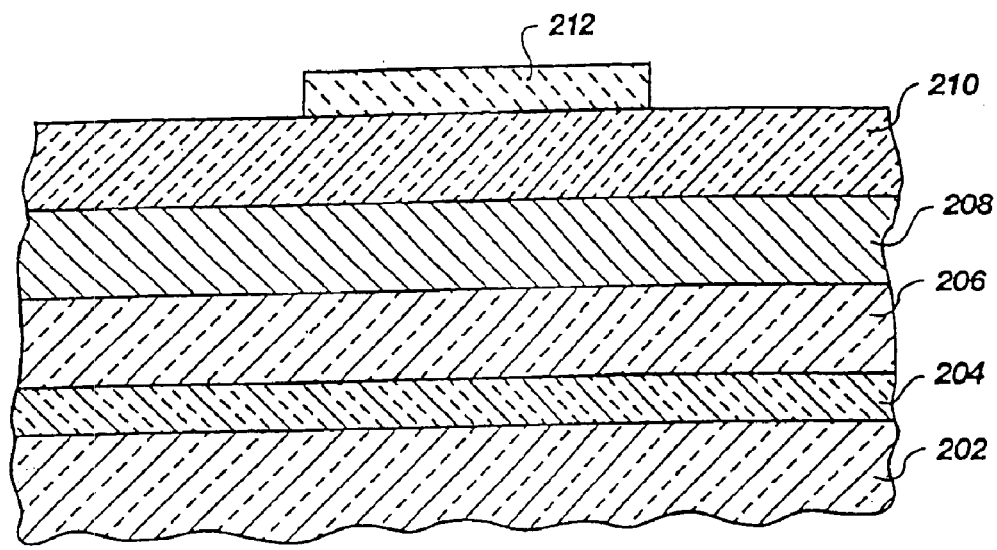
Figure 19:
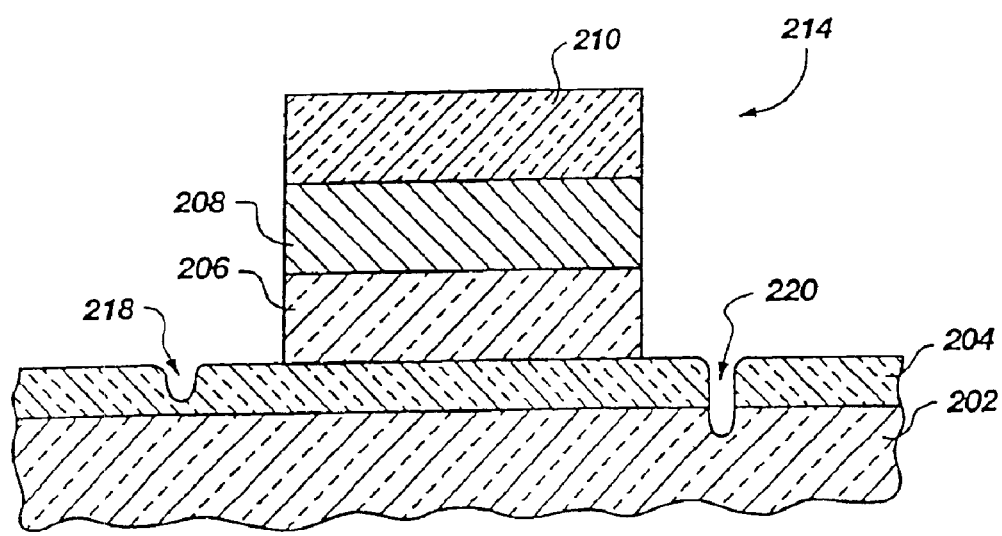
Figure 20:
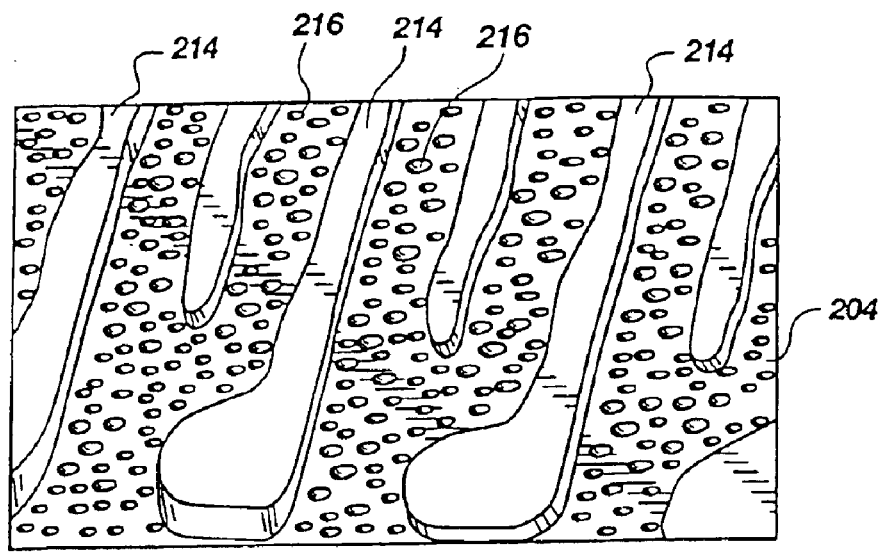
FIG. 20 is an oblique view of a gate stack and a pitted gate dielectric layer formed by a prior art method with annealing and high temperature cap formation.
Figure 21:
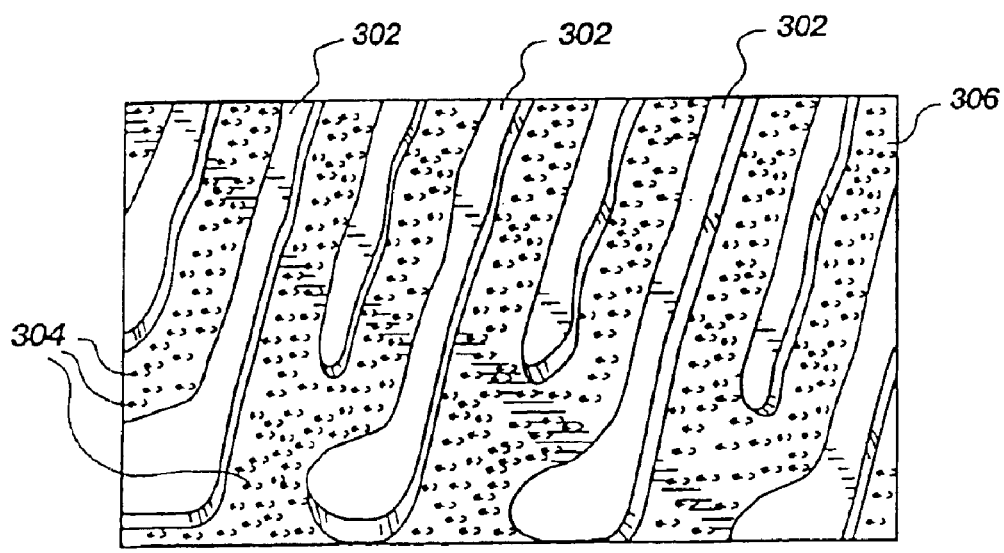
FIG. 21 is an oblique view of a gate stack and a pitted gate dielectric layer formed by a prior art method with high temperature cap formation.
Figure 22:
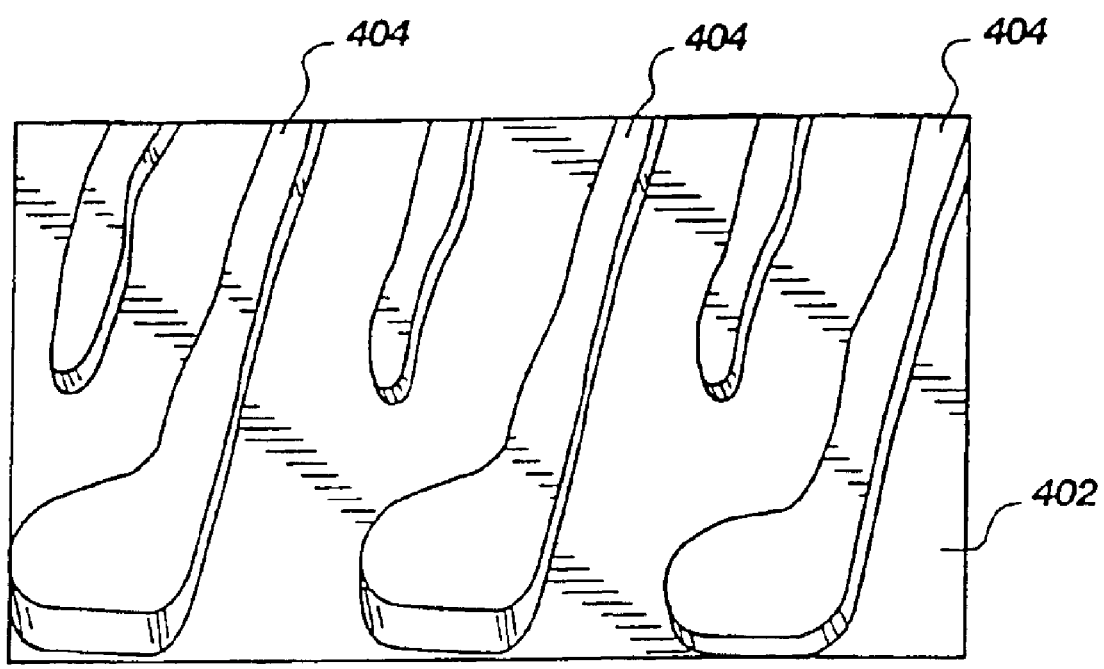
FIG. 22 is an oblique view of a gate stack and a gate dielectric layer formed by the present invention.
Figure 23:
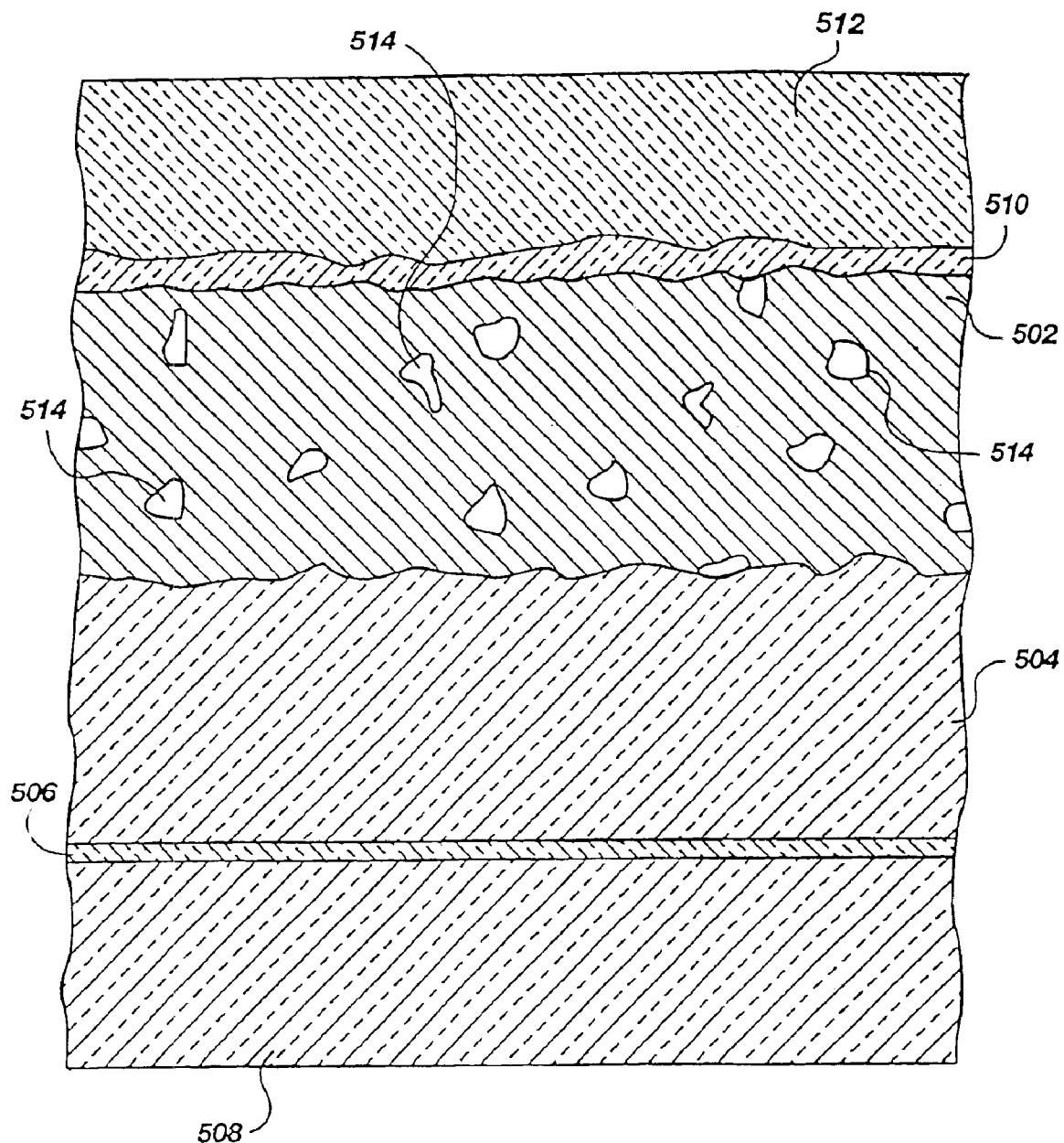
FIG. 23 is a side cross-sectional view of a prior art gate stack structure prior to etching.
Figure 24:
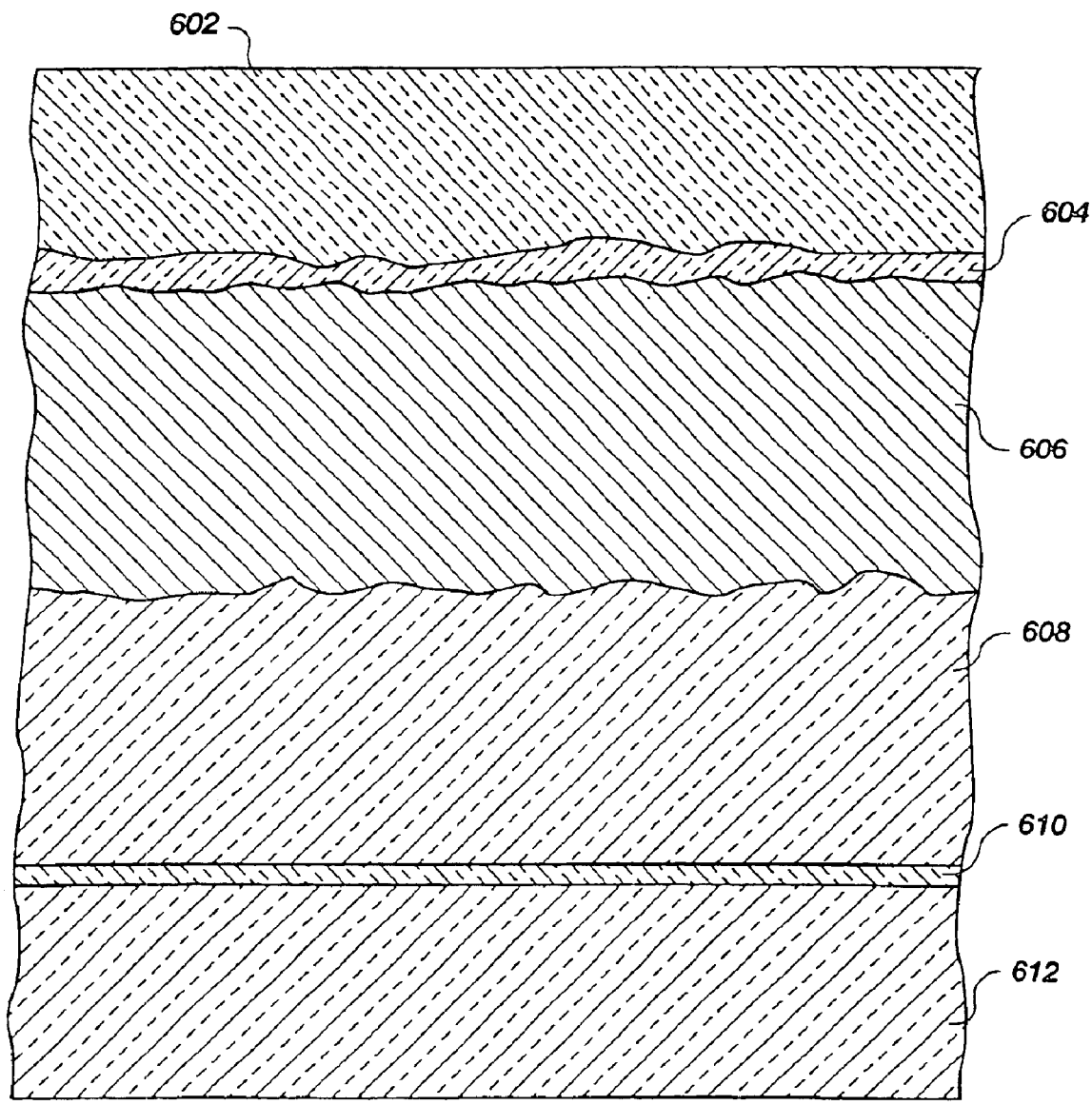
FIG. 24 is a side cross-sectional view of a gate stack structure of the present invention prior to etching.

As shown in FIG. 11, the structure 118 is subjected to an implantation 120 which disperses the silicon clusters 116 back into the metallic silicide film 108. The implantation 120 can be ions of silicon, tungsten, argon, or the like, or a dopant (phosphorous, arsenic, boron, and the like). The implantation 120 can be performed before and/or after the cap deposition. A resist 112 is then formed and patterned on the cap 110, as illustrated in FIG. 12. The structure 118 is then etched and the resist 112 stripped to form a gate stack 114, as shown in FIG. 13.

Having thus described in detail preferred embodiments of the present invention, it is to be understood that the invention defined by the appended claims is not to be limited by particular details set forth in the above description, as many apparent variations thereof are possible without departing from the spirit or scope thereof.

What is claimed is:

1. A method of forming a gate stack, comprising:

forming a gate dielectric layer on a silicon substrate;

forming a polysilicon layer on top of the gate dielectric layer;

subjecting the polysilicon layer to an ion implantation of impurities;

depositing a metallic silicide film in a non-annealed state atop the polysilicon layer; and depositing a dielectric cap layer formed from silicon nitride over the metallic silicide film at a temperature below about 600° C., wherein the temperature is sufficiently low to maintain the metallic silicide film in the non-annealed state.

2. The method of claim 1, wherein depositing the dielectric cap layer formed from silicon nitride over the metallic silicide film is effected at a temperature of between 400° C. and 600° C.

3. The method of claim 1, wherein depositing the dielectric cap layer formed from silicon nitride over the metallic silicide film is effected at a temperature of about 500° C.

4. The method of claim 1, wherein depositing the dielectric cap layer formed from silicon nitride over the metallic silicide film is effected at a temperature sufficiently low to preclude formation of silicon clusters in the metallic silicide film.

5. A method of forming a gate stack, comprising:

forming a gate dielectric layer on a silicon substrate;

forming a polysilicon layer on top of the gate dielectric layer;

subjecting the polysilicon layer to an ion implantation of impurities;

depositing a metallic silicide film in a non-annealed state atop the polysilicon layer; and depositing a dielectric cap layer formed from silicon nitride over the metallic silicide film at a temperature below about 600° C., wherein the temperature is sufficiently low to preclude formation of silicon clusters in the metallic silicide film.

6. The method of claim 5, wherein depositing the dielectric cap layer formed from silicon nitride over the metallic silicide film is effected at a temperature of between 400° C. and 600° C.

7. The method of claim 5, wherein depositing the dielectric cap layer formed from silicon nitride over the metallic silicide film is effected at a temperature of about 500° C.

8. A method for forming a gate stack, comprising:

providing a semiconductor substrate with a dielectric layer on an active surface of the semiconductor substrate, wherein a polysilicon layer is disposed over the dielectric layer;

forming a metallic silicide film in a non-annealed state over the polysilicon layer;

forming a dielectric cap from silicon nitride on the metallic suicide film at a sufficiently low temperature so that the metallic silicide film remains in the non-annealed state;

forming and patterning a resist layer on the dielectric cap;

etching the dielectric cap, the metallic silicide film, and the polysilicon layer; and stripping the resist layer.

9. The method of claim 8, wherein forming the dielectric cap is effected at a temperature below about 600° C.

10. The method of claim 8, wherein forming the dielectric cap from silicon nitride on the metallic silicide film is effected at a temperature of between 400° C. and 600° C.

11. The method of claim 8, wherein forming the dielectric cap from silicon nitride on the metallic silicide film is effected at a temperature of about 500° C.

12. The method of claim 8, wherein forming the dielectric cap from silicon nitride on the metallic silicide film is effected at a temperature sufficiently low to preclude formation of silicon clusters in the metallic silicide film.

* * * * *